(12) United States Patent
Haas et al.

(10) Patent No.: US 6,535,007 B2
(45) Date of Patent: Mar. 18, 2003

(54) COMPONENT HOLDER FOR TESTING DEVICES AND COMPONENT HOLDER SYSTEM MICROLITHOGRAPHY

(75) Inventors: Hermann Haas, Höhenkirchen (DE); Jens Lüpke, München (DE)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 09/852,969

(22) Filed: May 10, 2001

(65) Prior Publication Data

US 2001/0048314 A1 Dec. 6, 2001

(30) Foreign Application Priority Data

May 16, 2000 (DE) .......................... 100 24 875

(51) Int. Cl.⁷ ............................................. G01R 31/02
(52) U.S. Cl. ................................... 324/755; 324/158.1
(58) Field of Search ............................ 324/158.1, 754, 324/755, 765, 758, 757

(56) References Cited

U.S. PATENT DOCUMENTS

| | | | | |
|---|---|---|---|---|
| 4,489,364 A | * | 12/1984 | Chance et al. | ............... 361/395 |
| 4,924,179 A | * | 5/1990 | Sherman | |
| 5,896,037 A | * | 4/1999 | Kudla et al. | ................. 324/755 |
| 5,949,242 A | | 9/1999 | Wood et al. | |
| 6,018,249 A | | 1/2000 | Akram et al. | |
| 6,094,056 A | * | 7/2000 | Bardsley et al. | ............ 324/754 |
| 6,118,286 A | * | 9/2000 | Fredrickson | ................. 324/754 |
| 6,154,042 A | * | 11/2000 | Nevill | ......................... 324/760 |
| 6,208,156 B1 | * | 3/2001 | Hembree | ..................... 324/755 |
| 6,278,285 B1 | | 8/2001 | Weber et al. | |

FOREIGN PATENT DOCUMENTS

DE     37 13 155 A1     11/1988

\* cited by examiner

Primary Examiner—Michael Sherry
Assistant Examiner—Jimmy Nguyen
(74) Attorney, Agent, or Firm—Welsh & Katz, Ltd.

(57) ABSTRACT

A component holder for testing electronic components having a carrier, at least one component socket arranged on the carrier and having a group of component contacts to accommodate and make contact with a component, and at least one group of adapter contacts, which are arranged in a predefined standard arrangement on the carrier and are connected to the component contacts.

11 Claims, 2 Drawing Sheets

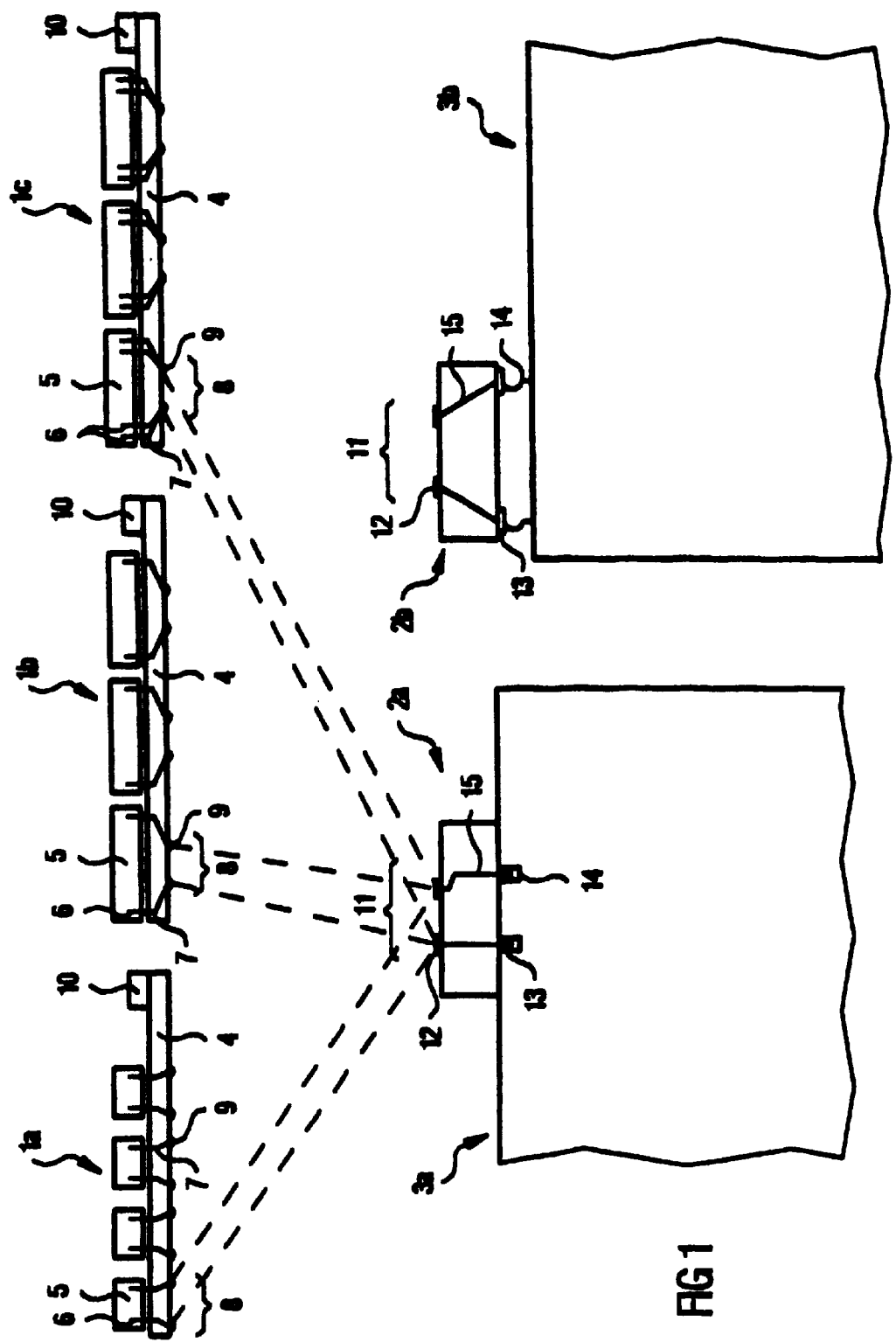

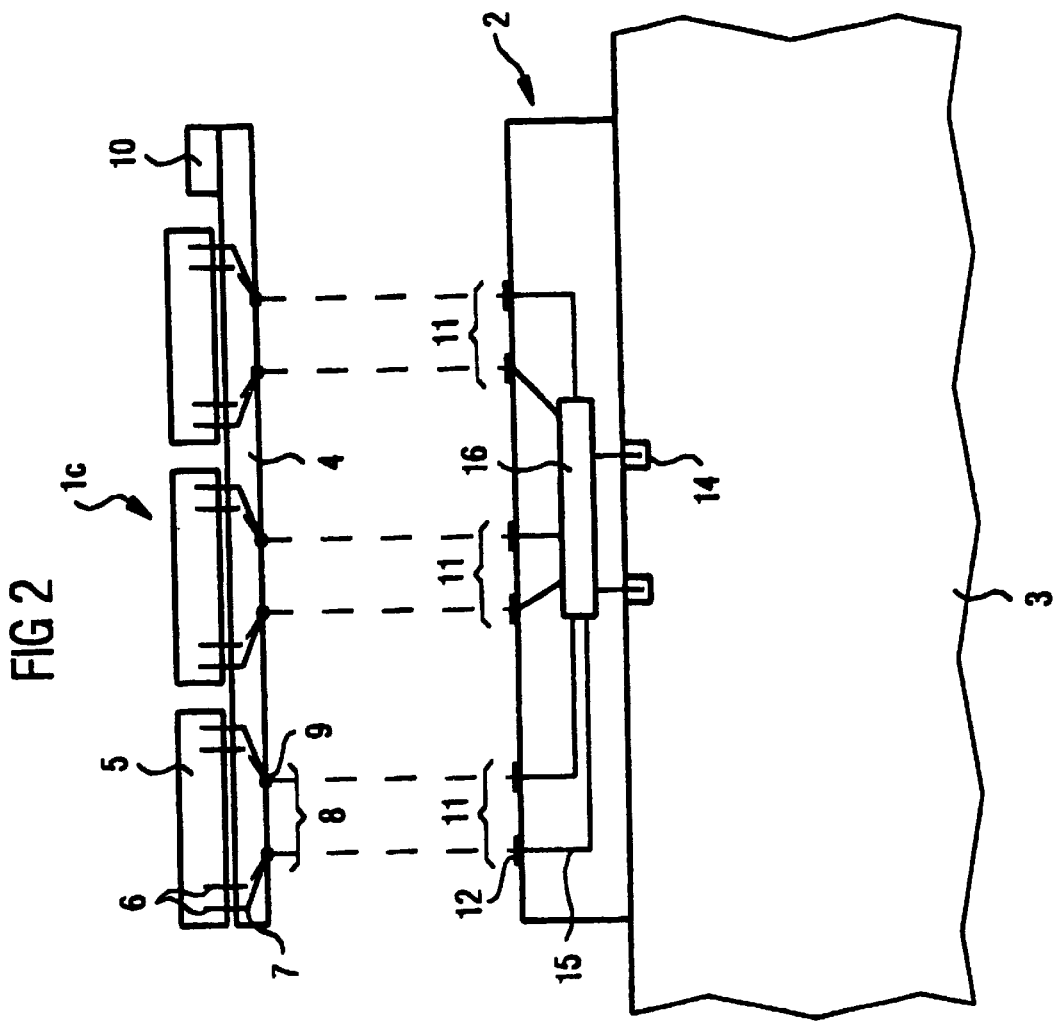

COMPONENT HOLDER FOR TESTING DEVICES AND COMPONENT HOLDER SYSTEM MICROLITHOGRAPHY

BACKGROUND OF THE INVENTION

The present invention relates to a component holder for testing electronic components, a component holder system comprising a component holder and an adapter to adapt to testing devices, and a testing system having a component holder, an adapter and testing devices.

Electronic components such as ICs, for example processors or memories, and also further circuits such as ASICs, are subjected to thorough tests for their use in order to ensure their serviceability. The tests are intended to test various electronic functionalities and to check the serviceability of the components under various environmental conditions as well. To this end, the components are usually subjected to a test which is carried out at operating speed; just like a burn-in test, in which the component is exposed to increased temperatures in order to simulate a manufacturing process. A typical test sequence for DRAM modules may have the following appearance, for example:
1. Pre burn-in test using a high-performance tester, as it is known;
2. Load burn-in boards used for the burn-in test;
3. Burn in, if appropriate again with a test during the burn-in;
4. First post burn-in test, a so-called hot test on the high performance tester;
5. Second post burn-in test, a so-called cold test on the high performance tester.

The prior art for handling the components to be tested is to insert (to load) the components for each of the above tests individually into the testing device used in each case and to remove them again after each test. This requires very awkward handling of the components and loads the connecting contacts of the components during each testing operation. In addition, for each testing device and for each component, it is necessary to provide a holder which permits the component and testing device to be connected mechanically and electrically. The number of necessary different component holders is therefore equal to the product of the testing devices used and the different components to be tested, or, respectively, the different number of packages for the components.

A further drawback in the individual tests of the components is to be seen in the fact that components can be interchanged when being sorted, which can lead to so-called "mixed devices". Such mistakes are extremely disadvantageous for subsequent processing and/or testing steps and, at present, can be corrected virtually only by hand.

In order to reduce the above disadvantages, it has been proposed to carry out the tests with components which remain in the transport pallets (so-called trays) provided for them. Apart from the comprehensive changes which are necessary on the testing devices in order to carry out this method, the component contacts are also loaded during each testing step in this case.

A further proposal consists in testing the components while they are still present in coherent strips. During assembly, integrated circuits are fitted to a carrier, from which at the same time the electrical contacts also branch. This carrier in each case contains eight holding positions for integrated circuits and is referred to as a strip. Part of the strip is the so-called lead frame, which surrounds the component carrier as a mechanical stabilizing means. After they have been finished, the individual components are then separated from the strip.

However, in the case of testing the components while they are still integrated in the strip, leads to the disadvantage that the separation and the shaping of the component (for example bending over the contact pins) are carried out only after the main test, so that a final functional test, including the handling need for this, still remains necessary.

SUMMARY OF THE INVENTION

The invention is therefore based on the object of simplifying the testing of electronic components without increasing the loading on the components, in particular at their contact surfaces.

According to the invention, this object is achieved by providing a component holder according to the independent patent claim 1, a component holder system according to the independent patent claim 15 and a testing system according to the independent patent claim 16. Further advantageous refinements, aspects and details of the present invention emerge from the dependent patent claims, the description and the appended drawing.

The invention is therefore directed to a component holder for testing electronic components, having a carrier, at least one component socket arranged on the carrier and having a group of component contacts to hold and make contact with a component, and at least one group of adapter contacts, which are arranged on the carrier in a predefined standard arrangement and are connected to the component contacts.

The principle on which the invention is based includes the use of adapters, which make it possible to couple any desired components to any desired testing devices, it being possible for the components to remain in a component holder, such an adapter, during all the tests and transport measures. The component holder, designed specifically for testing purposes, permits optimum adaptation to the necessities of the testing environment. One or more component sockets are arranged on a carrier. These sockets can be chosen in accordance with the design of the components to be tested and the electrical values to be complied with.

The component holder has at least one group of adapter contacts, which are connected to the contacts in the component socket and which serve to route the electrical signals and inputs away to a testing device. In this case, in principle two arrangements are possible, namely, firstly, the preferred embodiment, in which each group of component contacts is connected to its own group of adapter contacts and, secondly, the preferred embodiment in which all the groups of component contacts can be connected individually to a group of adapter contacts. The first of these two preferred embodiments has the advantage that no electronic or electrical wiring has to be carried out within the component holder, since all the contacts of all the components can be tapped off via the adapter contacts.

In contrast, the second preferred embodiment has the advantage that the component holder has to be placed on the testing device only once, and all the components can be tested one after another by switching over the contacts from one component socket to the next component socket. In this case, however, attention must be paid to the fact that the switching and circuit element used for the changeover operation to connect the component contacts to the adapter contact also have to be designed in such a way that they also satisfy, in the long term, the requirements placed on the component holder with regard to the ability to withstand temperature, etc.

The carrier can be a simple board, such as familiar to those skilled in the art as a circuit board.

In this case, a particularly simple embodiment constitutes arranging the at least one component socket and the adapter contacts on opposite surfaces of the board.

As already mentioned, it is preferred for a whole series of component sockets to be arranged on the carrier, not just a single component socket. For example, eight to 265 components would be typical, which can be accommodated jointly on a component holder, even more components being possible.

The component sockets are preferably DC isolated from one another.

As already mentioned above, the component holder must fulfill requirements on its stability during the tests. It is therefore preferred for the component holder to be so heat-resistant that it can withstand a temperature at which burn-in tests are carried out. Materials and processes for selecting the component socket, carrier and contacts which fulfill these requirements are familiar to those skilled in the art.

Furthermore, the component holder should preferably be designed to be vibration-proof, so that a secure contact with the components held in it is also ensured during burn-in tests. The ovens used for burn-in tests are operated with hot air, which is blown into the interior of the oven by vibrating fans. As a result, vibration phenomena occur in the entire oven. Reliable test results can be achieved in burn-in tests only if the components are held so firmly, or the component holder is connected so firmly to an adapter or the testing device that a reliable electrical contact is ensured.

Furthermore, the component holder can be designed in such a way that it is suitable for operation at the frequencies at which the components to be tested are operated in accordance with their specification. Components are designed for specific speed ranges of a clocking means, at least if they are digital components. Using specific preliminary tests, a decision is made during production as to what upper limit for the frequency load capacity a specific component may have. Reliable tests relating to the function of such a component may be obtained only if high-speed tests are carried out at the speed to be expected later. Therefore, the component holders according to the invention should also be designed appropriately. In particular, depending on the test used, the contacts should be low-resistant contacts, and also have a low inductance and a low capacitance. One important property for high-frequency suitability is that no jumps can occur in the impedance at the contacts.

In order also to ensure the mechanical functionality of the component holder, it is, moreover, preferred that it has devices with which it can be held and, incidentally, transported in at least one testing device. The obvious thing for this purpose in the simplest case is sufficiently wide edges of the carrier board, in which the gripping and holding mechanisms can engage. Other holder and transporting techniques, for example via incorporated magnets, etc., can also be imagined.

In order, even in a continuous production process with a high degree of automation, to be able to detect which components are on a specific component holder, and therefore to be able to start a corresponding testing program, it is further preferred for the component holder to have an encoding means which identifies the type of components which can be accommodated or are accommodated in the component holder. Such an encoding means can, for example, be an electronic device whose content can be read out. However, it can also be a device which operates optically or can be read optically, for example a light-emitting unit or a pattern of holes, executed in accordance with specific criteria, with different perforation depending on the type, which can be read with the aid of photocells.

The invention is additionally directed to a component holder system for use with testing devices for testing electronic components, the testing devices having a group of test adapter contacts, with at least one component holder according to the invention and one adapter for each of the testing devices with which the component holder system is to be used, the adapter having a group of component holder contacts in standard arrangement for making contact with at least one group of adapter contacts on the at least one component holder, and a group of testing device contacts, which are arranged in such a way that they can or do make contact with the test adapter contacts of a specific testing device, the testing device contacts being connected to the component holder contacts.

While, during the straightforward use of the component holder according to the invention, the testing devices would further have to be standardized with regard to their contacts, the use of additional adapters between component holder and testing device permits complete freedom in the choice of the testing device. As a result of the standard configuration of the adapter contacts of the component holder, on the one hand, and of the component holder contacts of the adapter, on the other hand, a uniform interface is provided. All the component holders therefore have to be designed in a standard way with regard to their corresponding adapter interface, just as all the adapters have to be designed in a standard way with regard to the component holder receptacle. The adaptation to individual components is performed by the component holder, the adaptation to individual testing devices is performed by the adapter.

If there are a number of groups of adapter contacts in standard configuration on one component holder, it is simply possible to reposition the component holder by one position in each case after a test, so that the adapter, and therefore also the testing device, comes into electrical contact with the next component.

It is likewise possible for the component holder to have a multiplicity of groups of adapter contacts, for the adapter to have the same multiplicity of groups of component holder contacts in the same arrangement as the adapter contacts; and for all the groups of component holder contacts to be connected to the group of testing device contacts. In this way, the distribution of electrical signals can be carried out in the adapter, which for this purpose must be provided with corresponding changeover devices. By means of this embodiment, the mechanical re-placement of the component holder on the adapter can be avoided.

In this case, the term "standard arrangement" of the groups of contacts is to be understood in such a way that at least those groups of adapter contacts which are connected to the same group of component holder contacts must be the same in all component holder types. On the other hand, the arrangements of the groups on a component holder can differ from one another, as long as it is ensured that the corresponding groups of groups on the adapter each have the respective same arrangement.

The standard arrangement of the contacts should be designed in such a way that the number of possible connections corresponds at least to the maximum number of contacts of those components envisaged for tests which have the most connections to the outside, in order to be able to test these as well. The spatial arrangement of the individual contacts of the standard configuration should be designed in such a way that at all the test frequencies and currents or voltages, etc., which may possibly occur, the contacts permit reliable transmission of the respective signals. Appropriate contact arrangements are familiar to those skilled in the art. In addition, with regard to the selection of the contact elements used here, recourse can be made to the relevant specialist knowledge of those skilled in the art in this field. For example, the use of point-like contacts, plugs or spring pins is possible.

The invention is finally also directed to a complete testing system for testing electronic components, which has: at least one component holder according to the invention, at least one testing device for testing the electrical properties of the at least one component, with a group of test adapter contacts, an adapter for each of the testing devices with which the component holder system is to be used, the adapter having a group of component holder contacts in standard arrangement for making contact with at least one group of adapter contacts on the at least one component holder, and a group of testing device contacts which are arranged in such a way that they can or do make contact with the test adapter contacts of a specific testing device, and which are connected to the component holder contacts.

All the statements made above with regard to the component holder system of course also apply to the complete testing system, which likewise comprises the testing device. Preferably, at least one of the testing devices is a testing device suitable for testing during a burn-in test. In addition, at least one of the testing devices can preferably carry out testing at frequencies at which the components to be tested are operated in accordance with their specification, as already mentioned above.

By means of the devices according to the invention, the mechanical loading of the components is minimized, since the latter have to be loaded into a component holder only once and remain therein for all the tests. The component holders are distinguished by a simple construction and therefore low production costs. Testing devices conventionally used can continue to be used, given the use of a suitable adapter, so that no re-equipment or new purchasing costs arise.

CONCISE DESCRIPTION OF THE DRAWINGS

FIG. 1 is a schematic showing the testing devices and component holders according the subject invention.

FIG. 2 is a second embodiment of the subject invention.

DETAILED DESCRIPTION OF EMBODIMENT OF THE INVENTION

In the following text, the invention is to be explained in more detail using a practical exemplary embodiment, reference being made to the appended drawings.

FIG. 1 shows, in the upper part, three component holders 1a, 1b, 1c according to the invention, in the middle part, adapters 2a and 2b according to the invention for use with the component holders according to the invention and, in the lower part of FIG. 1, various testing devices 3a and 3b.

FIG. 2 shows a further embodiment of the present invention, in which the adapter 2 has a plurality of contact groups.

The component holders comprise a carrier, for example a board 4, and component sockets 5 fitted thereto. The latter can be adapted in an optimum way to the components to be accommodated therein. Shown in the left-hand area are simple component sockets 5, in the central area there are somewhat larger component sockets, while the component sockets in the right-hand part are somewhat more complex, since these show two rows of contacts 6 located in one another, while the two other component holders each have only a single row of contacts 6 on both sides of the component. The component contacts 6 are connected via connections 7 to the adapter contacts 9, which in each case are combined to form groups 8 of adapter contacts which, in all the component holders, are designed in the same standard configuration. The dotted lines which lead from the inner contacts 6 of the right-hand component holder of FIG. 1 to the contacts 9 are intended to indicate that these contacts are located on a different plane of the drawing than the continuous connecting lines 7. The groups of adapter contacts arranged in standard configuration fit exactly onto corresponding groups 11 of component holder contacts which are arranged on the adapters 2a and 2b. Via connections 15, these contacts 12 are connected to the testing device contacts 13, which are configured in such a way that they are able to come into electrical engagement with the test adapter contacts 14. In this way, therefore, the adapters can be adapted in an optimum way to the testing device 3 respectively used. Shown in the left-hand part of FIG. 1 is a pair of contacts, which can comprise a pin and a spring socket. In the right-hand testing device 3b, contact surfaces are provided as testing device contacts 13, and can be pressed against spring contacts 14 belonging to the testing device 3b.

The adapters should also have holding mechanisms which fit the testing device, in order to make it possible for said adapters to be fixed to the latter securely and reliably.

FIG. 2 shows a preferred embodiment of the invention, in which the adapter 2 has a number of groups 11 of component holder contacts 12, each of which can be connected to corresponding groups 8 of adapter contacts 9 belonging to the component holder 11. In the adapter 2 there is a circuit 16 which is able to connect the component holder contacts to the testing device contacts via lines 15. The controller 16 can, for example, be an electronic or electromechanical circuit. It is possible to design the circuit in such a way that it can change over only entire groups of contacts, that it can switch a plurality of groups of component holder contacts in parallel, or that it can switch individual lines from the groups. The actual requirements on the circuit in this case are given by the tests to be carried out.

A typical test sequence, for example for DRAM modules, using the component holders according to the invention, could have the following appearance:

1. Load the component holder with a "test during load"
2. Pre burn-in test on the high performance tester, this step being optional;
3. Burn-in, including an appropriate test;
4. First post burn-in test as hot test on the high performance tester;
5. Second post burn-in test (cold test) on the high performance tester and
6. Unload the component holder.

As can be seen, a loading and an unloading operation have to be carried out only before the start and after the end of all the test, while during the individual tests the components remain in the component holder.

If a plurality of components can be tested simultaneously with one testing device, it is also possible to design the adapter in such a way that it is capable of being in contact simultaneously with a plurality of groups of adapter contacts, in order in this way to be able to carry out a plurality of tests on various components at the same time. In this case, it may be desirable not only to standardize the configuration within each group 9 of adapter contacts, but also the spatial arrangement of the groups 8 in relation to one another, in order not to need a new adapter for each component holder.

A component holder according to the invention generally contains no further electronic component and can therefore be produced very inexpensively. The sockets used are package-specific and should be suitable both for burn-in and for high speed tests. The burn-in board and Hifix are standardized for all DRAM types. A suitable adapter for a burn-in test can, for example, produce a connection between DUTs, can contain additional components, such as capacitors, and can be coupled mechanically to the component holder. The Hifix is a simple 1/1 connection between tester channels and contact points. The layout of the contact points should be selected in such a way that the cabling in the Hifix is as short as possible. Here, an adaptation to the pin electronics is achieved, it being possible, for example, for up to 256 DUTs (devices under test) or more to be tested at the same time. During burn-in tests, the loading and unloading of the component holders according to the invention can be carried out with the existing equipment for loading burn-in boards. In the case of high performance tests, however, a new handling system (so-called handler) has to be developed for stepping, as it is called (stepwise onward transport of the component holder according to the invention by one group of contacts in each case).

However, this will generally be less complicated and less susceptible to faults and, above all, take up less space than current tray handlers, which handle completed transport pallets.

What is claimed is:

1. A component holder system for test devices having a group of test adapter contacts for testing electronic components, said system comprising:
   at least one component holder, said component holder including
   a carrier;
   a plurality of component sockets arranged on said carrier each having a group of component contacts for receiving and contacting a respective component; and
   a corresponding plurality of groups of adapter contacts arranged in a predetermined arrangement on said carrier and each connected with the associated component contacts;
   and an adapter for each of said test devices which is attachable on said associated test device;
   wherein said adapter comprises a corresponding plurality of groups of component holder contacts in said predetermined arrangement for contacting said groups of adapter contacts;
   wherein said adapter comprises a group of test device contacts arranged such that said test adapter contacts of an associated test device are contactable therewith in the attached state, and which are electrically switchable to said component holder contacts by means of a circuit provided in said adapter.

2. Component holder system according to claim 1, wherein said carrier is a plate.

3. Component holder system according to claim 2, wherein said at least one component socket and said adapter contacts are arranged on opposite surfaces of said plate.

4. Component holder system according to claim 1, wherein said component sockets are galvanically separated from each other.

5. Component holder system according to claim 1, wherein said component holder is heatresistant up to a temperature at which burn-in tests are performed.

6. Component holder system according to claim 3, wherein said component holder is arranged vibration-proof such that a safe contact of the components loaded on it is ensured during burn-in tests.

7. Component holder system according to claim 1, wherein said component holder is arranged for operation at frequencies at which the components to be tested are operable in accordance with the specification.

8. Component holder system according to claim 1, wherein said component holder comprises means with which it may be fixed and transported in at least one test device.

9. Component holder system according to claim 1, wherein said component holder further comprises coding means which denotes the type of the components to be loaded in said component holder.

10. Component holder system according to claim 9, wherein said coding means is an electronic means.

11. Component holder system according to claim 10, wherein said coding means is an optically operating and readable means, respectively.

* * * * *